US005377276A

United States Patent [19]

Terai et al.

[11] Patent Number: 5,377,276

[45] Date of Patent: Dec. 27, 1994

[54] NOISE CONTROLLER

[75] Inventors: Kenichi Terai, Osaka; Yasutoshi Nakama, Ikoma; Hiroyuki Hashimoto, Daitou; Tadashi Tamura, Toyonaka, all of Japan

[73] Assignee: Matsushita Electric Industrial Co., Ltd., Osaka, Japan

[21] Appl. No.: 117,717

[22] Filed: Sep. 8, 1993

[30] Foreign Application Priority Data

Sep. 30, 1992 [JP] Japan .................................. 4-261163

[51] Int. Cl.[5] .............................................. H03B 29/00

[52] U.S. Cl. .......................................... 381/71; 381/94

[58] Field of Search .................................... 381/71, 94

[56] References Cited

U.S. PATENT DOCUMENTS 5,117,401 5/1992 Feintuch ................................ 381/71

FOREIGN PATENT DOCUMENTS 1-501344 5/1989 Japan .

OTHER PUBLICATIONS

Widrow, Bernard, et al., "Adaptive Noise Cancelling: Principles and Applications," Proc. IEEE, vol. 63 No. 12, Dec. 1975.

"Adaptive Signal Processing", Widrow et al., 1985, pp. 290–291.

*Primary Examiner*—Curtis Kuntz
*Assistant Examiner*—Mark D. Kelly
*Attorney, Agent, or Firm*—Wenderoth, Lind & Ponack

[57] ABSTRACT

An active noise controller includes a prediction filter which includes a delayer for delaying the noise or error detection signal by a predetermined period of time, a first adaptive filter for processing the output of the delayer to deliver its periodic component, and a subtractor for subtracting the output of the first adaptive filter from the noise detection signal to deliver a random component of the signal. More specifically, the prediction filter is capable of dividing the noise or error detection signal into two, periodic and random, components. In addition, two, second and third, adaptive filters are provided for processing the periodic and random components respectively. Accordingly, the second and third adaptive filters become responsive precisely to their respective periodic and random components regardless of the ratio in level between the two components, whereby any undesired noise consisting of the two discrete components will be suppressed.

6 Claims, 7 Drawing Sheets

NOISE CONTROLLER

BACKGROUND OF THE INVENTION

1. Field of the Invention

The present invention relates to a noise controller for performing an active noise control to suppress an unwanted ambient noise.

2. Description of the Invention

A conventional noise controller for such an active noise control is disclosed in International Patent Publication WO88/02912, in which a control signal is produced by feeding an adaptive filter with data of e.g. the rotational speed of an engine which is a possible source of noise. The control signal transmitted to a control speaker for generating a control sound to cancel the noise. Also, a difference between the control sound and the unwanted noise is measured by an error detector and the coefficient of the adaptive filter is updated so that the difference becomes minimum in level. However, the arrangement suggested in WO88/02912 permits the detection of only a periodic component of the noise from the engine and fails to detect a random component, e.g. a road noise, the same which then remains unsuppressed.

One more noise detector for detection of the random component may be added to the conventional noise controller. However, if the periodic component is greater than the random component, its change in the gain and phase will vary the filter response of the adaptive filter which in turn causes the random component to remain intact. When the random component is high in proportion, the adaptive filter becomes subjected to a noise transfer function and will not be responsive to suppress the periodic component which varies in both amplitude and phase. Also, the adaptive filter fails to stay uniform in the filter response when the ratio in level between the periodic component and the random component is varied with time.

SUMMARY OF THE INVENTION

It is an object of the present invention to provide a noise controller capable of suppressing any undesired noise from a noise source by canceling both periodic and random components of the noise at one time.

For achievement of the above object, a noise controller according to the present invention is provided with a prediction filter which comprises a delayer for delaying a detected noise signal or error signal (representing a difference between the noise and a control sound) by a predetermined length of time, a first adaptive filter for processing an output of the delayer to deliver a periodic component of the noise or error signal, and a subtractor for subtracting an output of the first adaptive filter, or periodic component, from the noise or error signal to deliver a random component. More specifically, the prediction filter divides the noise or error signal into two, periodic and random, components. There is provided at least either a prediction filter for dividing the noise signal into two components or a prediction filter for dividing the error signal into two components. In addition, two, second and third, discrete adaptive filters are provided to process the periodic and random components respectively. The second and third adaptive filters are arranged to become responsive stably and precisely to their respective periodic and random components of the detected signal so that the two components are canceled at one time.

In more detail, a preferred noise controller of the present invention comprises: a noise detector for detecting a noise or vibration from a noise or vibration source and delivering a noise detection signal corresponding to a level of the noise or vibration; a delayer for delaying the noise detection signal by a predetermined length of time; a first adaptive filter for processing an output of the delayer; a subtractor for subtracting an output of the first adaptive filter from the noise detection signal produced by the noise detector; a first coefficient updator responsive to an output of the subtractor for updating a coefficient of the first adaptive filter so that the output of the subtractor becomes minimum; a second adaptive filter for processing the output of the subtractor; a third adaptive filter for processing the output of the first adaptive filter; an adder for summing an output of the second adaptive filter and an output of the third adaptive filter; a control speaker responsive to an output of the adder for producing a control sound; an error detector for detecting a difference between the control sound from the control speaker and the noise or vibration and delivering an error detection signal corresponding to the difference; a second coefficient updator responsive to the error detection signal for updating a coefficient of the second adaptive filter so that the level of the error detection signal becomes minimum; and a third coefficient updator responsive to the error detection signal for updating a coefficient of the third adaptive filter so that the level of the error detection signal becomes minimum.

Another preferred noise controller of the present invention comprises: first and second noise detectors each for detecting a noise or vibration from a noise or vibration source and delivering a noise detection signal corresponding to the level of the noise or vibration; a first delayer for delaying by a predetermined length of time the noise detection signal from the first noise detector; a first adaptive filter for processing an output of the first delayer; a first subtractor for subtracting an output of the first adaptive filter from the noise detection signal produced by the first noise detector; a second delayer for delaying by a predetermined length of time the noise detection signal from the second noise detector; a second adaptive filter for processing an output of the second delayer; a second subtractor for subtracting an output of the second adaptive filter from the noise detection signal produced by the second noise detector; a third adaptive filter for processing an output of the first subtractor; a fourth adaptive filter for processing the output of the first adaptive filter; a fifth adaptive filter for processing an output of the second subtractor; a sixth adaptive filter for processing the output of the second adaptive filter; an adder for summing outputs of the third to sixth adaptive filters; a control speaker responsive to an output of the adder for producing a control sound; and an error detector for detecting a difference between the control sound from the control speaker and the noise or vibration and delivering an error detection signal corresponding to the difference. The first adaptive filter includes a coefficient updator responsive to the output of the first subtractor for updating a coefficient of the first adaptive filter so that the level of the output of the first subtractor becomes minimum. Also, the second adaptive filter includes a coefficient updator responsive to the output of the second subtractor for updating the coefficient of the second adaptive filter so that the level of the output of the second subtractor becomes minimum. Also, each of the third to sixth adaptive filters includes a coefficient updator responsive to the error detection signal for updating a filter coefficient thereof so that the level of the error detection signal becomes minimum.

A further preferred noise controller of the present invention comprises: a noise detector for detecting a noise or vibration from a noise or vibration source and delivering a noise detection signal corresponding to a level of the noise or vibration; a delayer for delaying the noise detection signal by a predetermined length of time; a first adaptive filter for processing an output of the delayer; a subtractor for subtracting an output of the first adaptive filter from the noise detection signal produced by the noise detector; second to fifth adaptive filters each for processing an output of the subtractor; sixth to ninth adaptive filters for processing the output of the first adaptive filter; a first adder for summing outputs of the second, third, sixth and seventh adaptive filters; a second adder for summing outputs of the fourth, fifth, eighth and ninth adaptive filters; a first control speaker responsive to an output of the first adder for producing a control sound; a second control speaker responsive to an output of the second adder for producing a control sound; and first and second error detectors each for detecting a difference between the control sound from a corresponding one of the first and second control speakers and the noise or vibration and delivering an error detection signal corresponding to the difference. The first adaptive filter includes a coefficient updator responsive to the output of the subtractor for updating a coefficient of the first adaptive filter so that the level of the output of the subtractor becomes minimum. Also, each of the second, fourth, sixth, and eighth adaptive filters includes a coefficient updator responsive to the error detection signal produced by the first error detector for updating a filter coefficient thereof so that the level of the error detection signal becomes minimum. Similarly, each of the third, fifth, seventh and ninth adaptive filters includes a coefficient updator responsive to the error detection signal produced by the second error detector for updating a coefficient thereof so that the level of the error detection signal becomes minimum.

A still further preferred noise controller of the present invention comprises: a noise detector for detecting a noise or vibration from a noise or vibration source and delivering a noise detection signal corresponding to a level of the noise or vibration; first and second adaptive filters each for processing the noise detection signal; an adder for summing outputs of the first and second adaptive filters; a control speaker responsive to an output of the adder for producing a control sound; an error detector for detecting a difference between the control sound from the control speaker and the noise or vibration and delivering an error detection signal corresponding to the difference; a delayer for delaying the error detection signal from the error detector by a predetermined length of time; a third adaptive filter for processing an output of the delayer; and a subtractor for subtracting an output of the third adaptive filter from the error detection signal produced by the error detector. The first adaptive filter includes a coefficient updator responsive to an output of the subtractor for updating a coefficient of the first adaptive filter so that the level of the output of the subtractor becomes minimum. Also, the second adaptive filter includes a coefficient updator responsive to the output of the third adaptive filter for updating a coefficient of the second adaptive filter so that the level of the output of the third adaptive filter becomes minimum. The third adaptive filter includes a coefficient updator responsive to the output of the subtractor for updating a coefficient of the third adaptive filter so that the level of the output of the subtractor becomes minimum.

A still further preferred noise controller of the present invention comprises: a noise detector for detecting a noise or vibration from a noise or vibration source and delivering a noise detection signal corresponding to a level of the noise or vibration; a first delayer for delaying the noise detection signal by a predetermined length of time; a first adaptive filter for processing an output of the first delayer; a first subtractor for subtracting an output of the first adaptive filter from the noise detection signal produced by the error detector; a second adaptive filter for processing an output of the first subtractor; a third adaptive filter for processing the output of the first adaptive filter; an adder for summing outputs of the second and third adaptive filters; a control speaker responsive to an output of the adder for producing a control sound; an error detector for detecting a difference between the control sound from the control speaker and the noise or vibration and delivering an error detection signal corresponding to the difference; a second delayer for delaying the error detection signal by a predetermined length of time; a fourth adaptive filter for processing an output of the second delayer; and a second subtractor for subtracting an output of the fourth adaptive filter from the error detection signal produced by the error detector. The first adaptive filter includes a coefficient updator responsive to an output of the first subtractor for updating a coefficient of the first adaptive filter so that the level of the output of the first subtractor becomes minimum. Also, each of the second and fourth adaptive filters includes a coefficient updator responsive to an output of the second subtractor for updating a filter coefficient thereof so that the level of the output of the second subtractor becomes minimum. The third adaptive filter includes a coefficient updator responsive to the output of the fourth adaptive filter for updating the coefficient of the third adaptive filter so that the level of the output of the fourth adaptive filter becomes minimum.

A still further preferred noise controller of the present invention comprises: a noise detector for detecting a noise or vibration from a noise or vibration source and delivering a noise detection signal corresponding to a level of the noise or vibration; a first delayer for delaying the noise detection signal by a predetermined length of time; a first adaptive filter for processing an output of the first delayer; a first subtractor for subtracting an output of the first adaptive filter from the noise detection signal produced by the error detector; a second adaptive filter for processing an output of the first subtractor; a third adaptive filter for processing an output of the first adaptive filter; an adder for summing outputs of the second and third adaptive filters; a control speaker responsive to an output of the adder for producing a control sound; an error detector for detecting a difference between the control sound from the control speaker and the noise or vibration and delivering an error detection signal corresponding to the difference; a second delayer for delaying the error detection signal by a predetermined length of time; a fourth adaptive filter for processing an output of the second delayer; a second subtractor for subtracting an output of the fourth adaptive filter from the error detection signal produced by the error detector; a first coefficient updator responsive to an output of the second delayer for updating a coefficient of the fourth adaptive filter so that the output of second delayer becomes minimum; a first FIR filter for processing the output of the first delayer; a third delayer for delaying an output of the first FIR filter by a predetermined length of time; a fifth adaptive filter for processing an output of the third delayer; a third subtractor for subtracting an output of the fifth adaptive filter from the output of the first FIR filter; a second coefficient updator responsive to an output of the second subtractor and the third subtractor for updating a coefficient of the second adaptive filter so that the level of the output of second delayer becomes minimum; a second FIR filter for processing the output of the first adaptive filter; a fourth delayer for delaying an output of the second FIR filter by a predetermined length of time; a sixth adaptive filter for processing an output of the fourth delayer; and a third coefficient updator responsive to the output of the fourth adaptive filter and the sixth adaptive filter for updating a coefficient of the third adaptive filter so that the level of the output of the fourth adaptive filter becomes minimum. The first adaptive filter includes a coefficient updator responsive to the output of the first subtractor for updating a coefficient of the first adaptive filter so that the level of the output of the first subtractor becomes minimum. Also, a coefficient of each of the fifth and sixth adaptive filters is updated by the first coefficient updator to be the same as the coefficient of the fourth adaptive filter.

DESCRIPTION OF THE PREFERRED EMBODIMENTS

A first embodiment of the present invention will be described referring to FIG. 1. A noise controller according to the first embodiment is designed for dividing a noise detection signal with a prediction filter into two, periodic and random, components and subjecting the two discrete components to a couple of adaptive filters respectively to attenuate the two components equally at one time regardless of any change in their proportion or level.

Figure 1:
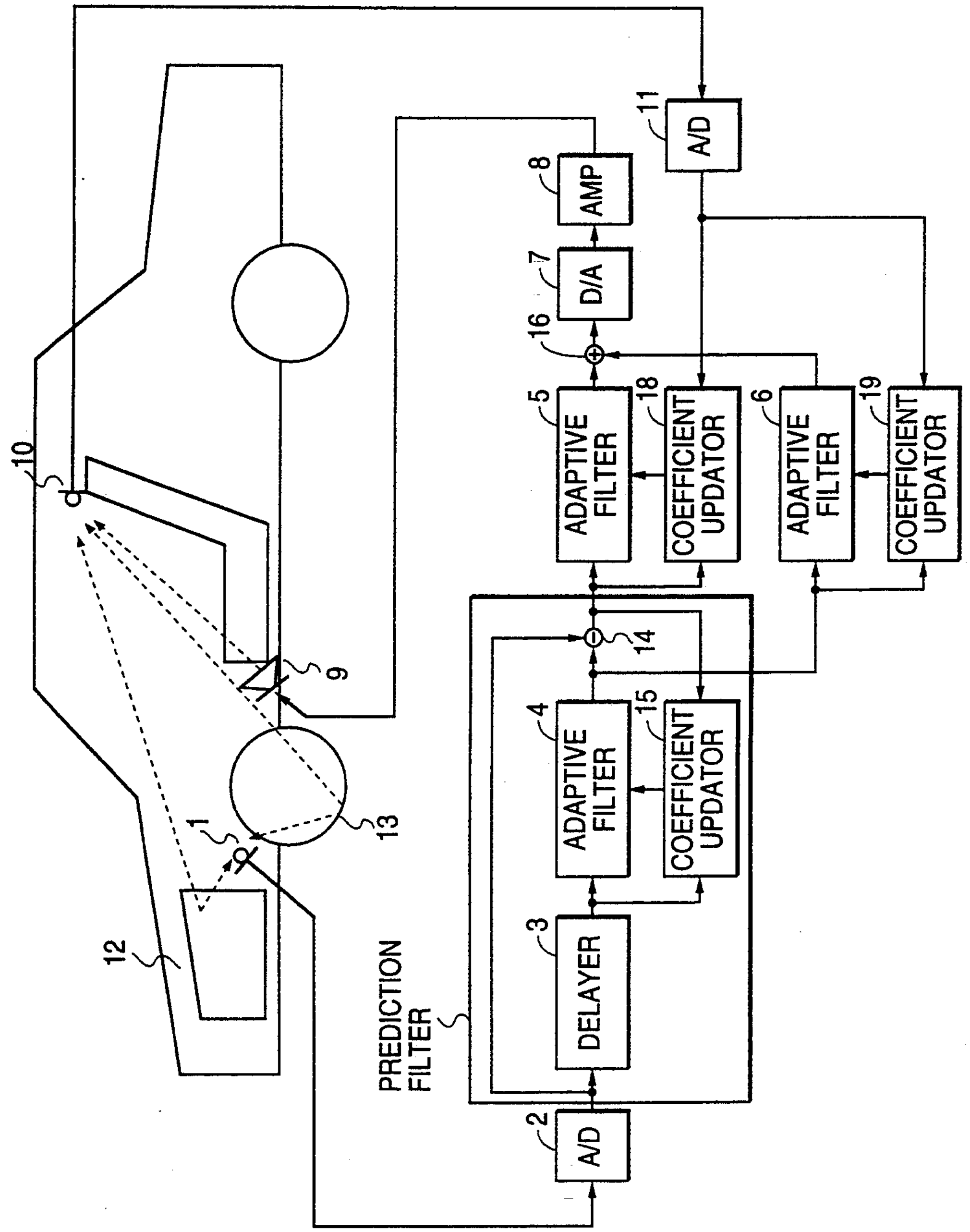
FIG. 1 is a schematic view showing a first embodiment of the present invention.

As shown in FIG. 1, the noise is detected by a noise detector 1 (microphone) disposed adjacent to an engine 12 and front wheels 13 of a vehicle and converted by an A/D (analog-to-digital) converter 2 to a digital noise detection signal. The digital noise detection signal is delayed a given period of time by a delayer 3. The delayed signal is then fed to an adaptive filter 4 where a periodic component is extracted from the delayed signal. A subtractor 14 is provided for subtracting the periodic component or output of the adaptive filter 4 from the digital noise detection signal to produce a random component. The random component is fed as an input error signal to a coefficient updator 15 which in response updates the coefficient of the adaptive filter 4 with reference to the delayed output or input reference signal from the delayer 3 so that the output of the subtractor 14 or input error signal becomes minimum in level. In other words, the noise detection signal is divided into the two, periodic and random, components by a prediction filter which consists of the delayer 3, the adaptive filter 4, and the subtractor 14. Then, the random component is processed by another adaptive filter 5 while the periodic component is processed by a further adaptive filter 6 separately. The two outputs of the adaptive filters 5 and 6 are summed by an adder 16. The digital sum signal of the adder 16 is converted back by a D/A (digital-to-analog) converter 7 to its analog form. The analog signal of the D/A converter 7 is amplified by a power amplifier 8 to drive a control speaker 9. The control speaker 9 emits a corresponding intensity of control sound towards the head of a driver of the vehicle or noise control point to cancel the noise including a direct noise from the engine 12 and a road noise from the front wheels 13. A difference at the noise control point between the emitted control sound and the undesired noise is picked up by an error detector 10 (microphone). The resultant difference signal produced by the error detector 10 is converted by an A/D converter 11 to its digital form. The digital difference signal of the A/D converter 11 is fed as an input error signal to two coefficient updators 18 and 19. In response to the input error signal, the coefficient updator 18 updates the coefficient of the adaptive filter 5 with reference to the random component of the noise detection signal supplied from the subtractor 14 so that the level of the input error signal becomes minimum. Similarly, the coefficient updator 19 updates the coefficient of the adaptive filter 6 in reference to the periodic component of the noise detection signal from the adaptive filter 4 so that the level of the input error signal from the error detector 10 becomes minimum. The algorithm used in the three coefficient updators 15, 18, and 19 may be of a known LMS (least mean square) method such as depicted in "Adaptive Signal Processing" by B. Widrow and S. D. Stearns, published by Prentice-Hall Inc. (US) in 1985, p. 290.

The noise controller of the first embodiment allows its adaptive filter 4 to be coefficient updated so that the difference between the noise detection signal and the delayed signal of the delayer 3 can be minimized and to deliver a periodic component of the noise detection signal which is predictable from the preceding signal. A random component is produced by the subtractor 14 where the periodic component is subtracted from the original noise detection signal. The two discrete components are then filtered by the two adaptive filters 5 and 6 respectively of which coefficients are modified so as to minimize the level of the input error signal or output of the error detector 10. More particularly, the adaptive filter 5 is coefficient updated to determine an optimum noise transfer function while the adaptive filter 6 is separately updated to respond to a change (in gain or phase) of the periodic component of the noise detection signal. As the result, the two components will equally be suppressed at one time.

Although there is only detector of each type, the noise detector or the error detector, in the first embodiment, two or more defectors can be used with equal success.

Figure 2:
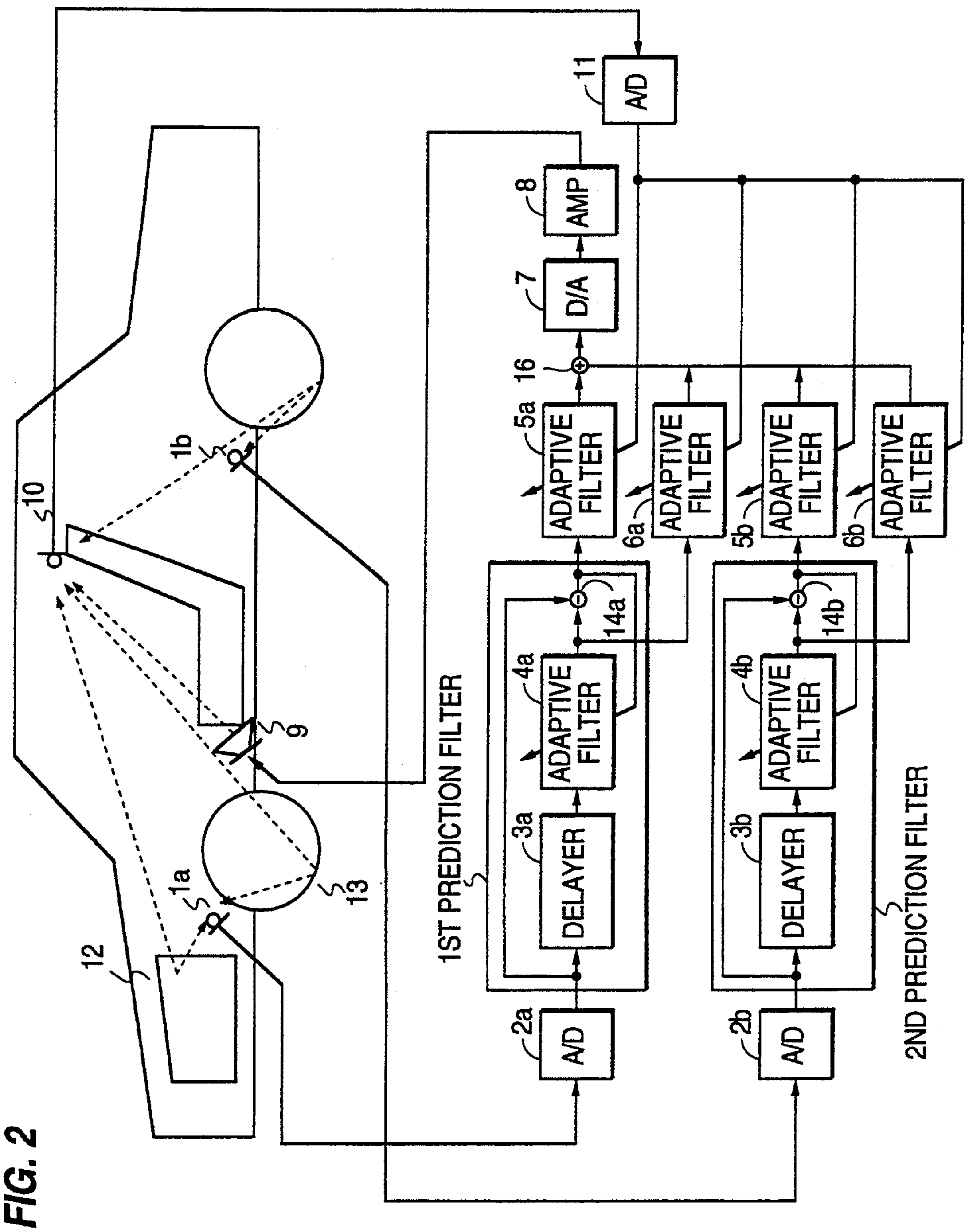
FIG. 2 is a schematic view showing a second embodiment of the present invention.
Figure 3A:
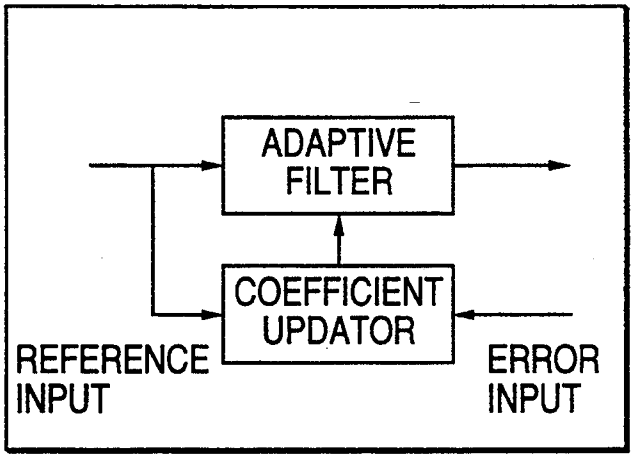
FIGS. 3*a*–3*b* are explanatory views of an adaptive filter accompanied by a coefficient updator according to the present invention.
Figure 3B:
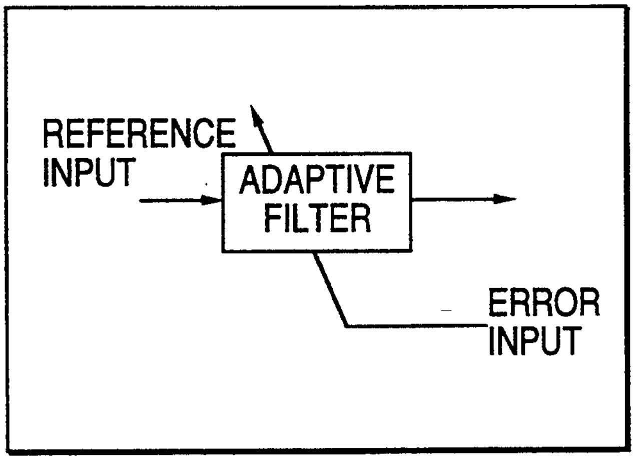

A second embodiment of the present invention will now be described referring to FIG. 2, which is distinguished from the first embodiment by the fact that the noise is detected from two different noise sources. As shown in FIG. 2, the a microphone or noise detector 1*a* is disposed in the front of a vehicle and another noise detector 1*b* is disposed in the rear. Detection signals of the two noise detectors 1*a* and 1*b* are converted by two A/D converters 2*a* and 2*b* to their digital equivalents respectively. The digital noise detection signal of the A/D converter 2*a* is divided into two, periodic and random, components by a first prediction filter which comprises a delayer 3*a*, an adaptive filter 4*a*, and a subtractor 14*a*. It should be understood that each adaptive filter shown in FIGS. 2 to 7 contains a coefficient updator as illustrated in FIG. 3*a* and is expressed by the illustration of FIG. 3*b*. Similarly, the digital noise detection signal of the A/D converter 2*b* is divided into two, periodic and random, components by a second prediction filter which comprises a delayer 3*b*, an adaptive filter 4*b*, and a subtractor 14*b*. The random component of the digital noise detection signal derived from the front of the vehicle is processed by an adaptive filter 5*a*. The random component of the digital noise detection signal derived from the rear of the vehicle is processed by a further adaptor 5*b*. Also, the two periodic components derived from the front and rear of the vehicle are processed by two adaptive filters 6*a* and 6*b* respectively. The other actions are identical to those of the first embodiment shown in FIG. 1. The second embodiment is responsive to two noise sources while providing the same effects as of the first embodiment. While there has been described in the form of a noise controller, the second embodiment is not limited to the two noise detectors and three or more noise detectors can successfully be employed.

Figure 4:
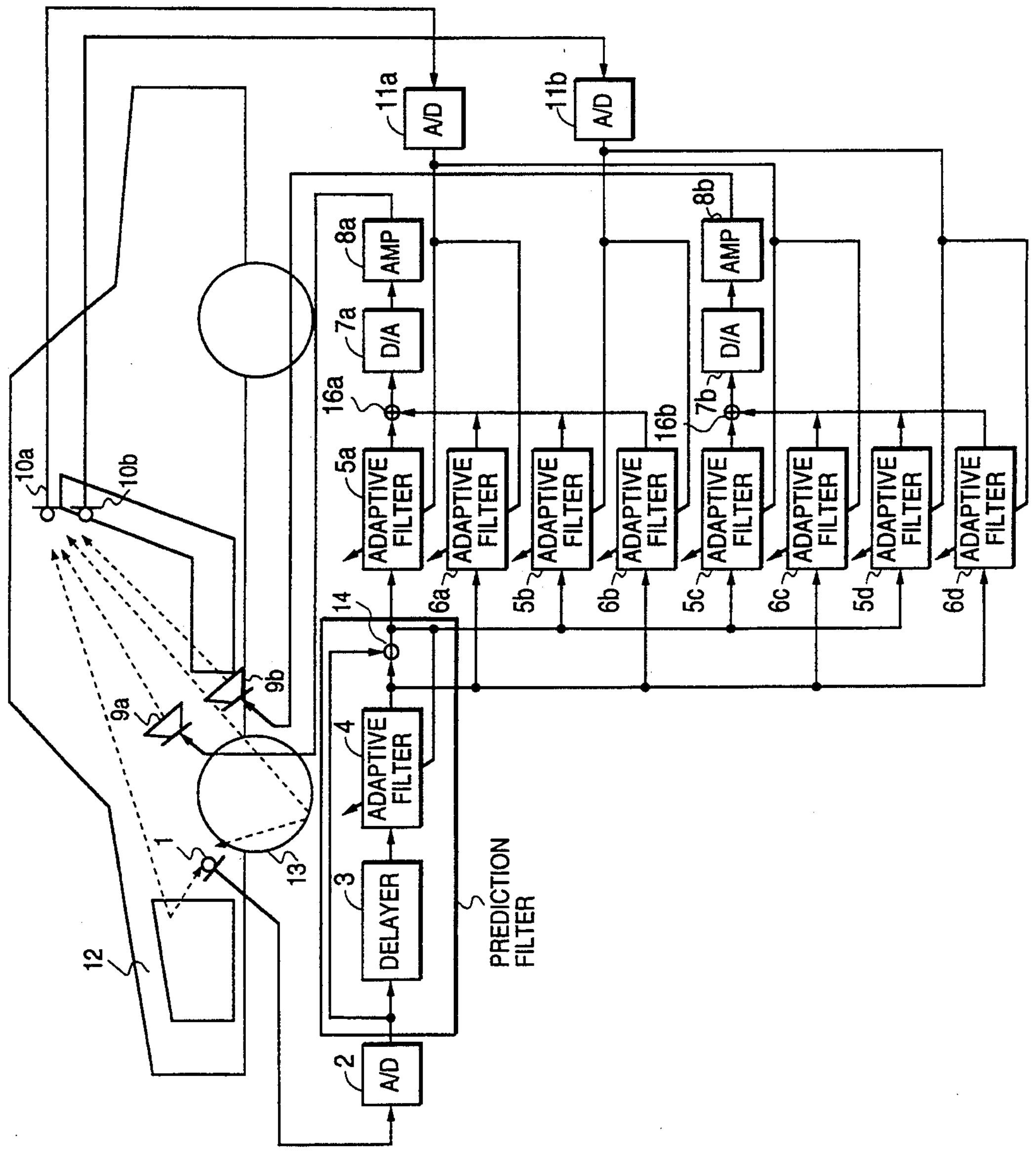
FIG. 4 is a schematic view showing a third embodiment of the present invent ion.

A third embodiment of the present invention will be described referring to FIG. 4, which is distinguished from the first embodiment by the fact that two pairs of the error detectors and the control speakers are provided for canceling an unwanted noise in a greater space. As there are provided two propagation lines from the noise sources to the noise detectors and two more propagation lines from the speakers to the noise detectors, four adaptive filter systems are needed for signal processing. More specifically, the random component of a noise detection signal from the noise detector 1 is fed to an adaptive filter 5*a* which in turn produces a control signal so that a noise intercepted by the error detector 10*a* (microphone) is canceled by the corresponding control sound from the speaker 9*a*. Similarly, the periodic component of the noise detection signal from the noise detector 1 is fed to an adaptive filter 6*a* which in turn produces a control signal so that the noise intercepted by the error detector 10*a* (microphone) is canceled by the control sound from the speaker 9*a*. A pair of adaptive filters 5*b* and 6*b* are responsive to the random and periodic components of the noise detection signal respectively for producing a control signal to cause the control sound of the speaker 9*a* to cancel a noise sound intercepted by the other error detector 10*b* (microphone). An adder 16*a* is provided for summing outputs of the four adaptive filter 5*a*, 6*a*, 5*b*, and 6*b* to produce a sum or control signal which is further transmitted through a D/A converter 7*a*. Equally, another pair of adaptive filters 5*c* and 6*c* are responsive to the random and periodic components respectively for generating a control sound of the speaker 9*b* to cancel the noise intercepted by the error detector 10*a*. A further pair of adaptive filters 5*d* and 6*d* are responsive to the random and periodic components respectively for causing the control sound of the speaker 9*b* to cancel the noise intercepted by the error detector 10*b*. Also, an adder 16*b* is provided for summing outputs of the four adaptive filters 5*c*, 6*c*, 5*d*, and 6*d* to produce a sum signal which is then transmitted through a D/A converter 7*b*. The other actions are identical to those of the first embodiment shown in FIG. 1. The third embodiment allows the unwanted noise to be canceled at efficiency by a plurality of different directional control sounds from their respective speakers associated with the corresponding number of the error detectors. It would be understood that the third embodiment is not limited to the two control speakers and three or more of the control speakers can successfully be employed.

A fourth embodiment of the present invention will be described referring to FIG. 5. A noise controller of the fourth embodiment allows its prediction filter to divide the error detection signal into two, periodic and random, components which are then used for updating the coefficients of two adaptive filters respectively. Accordingly, the two components will equally be suppressed at one time regardless of a change in their proportion or level.

Figure 5:
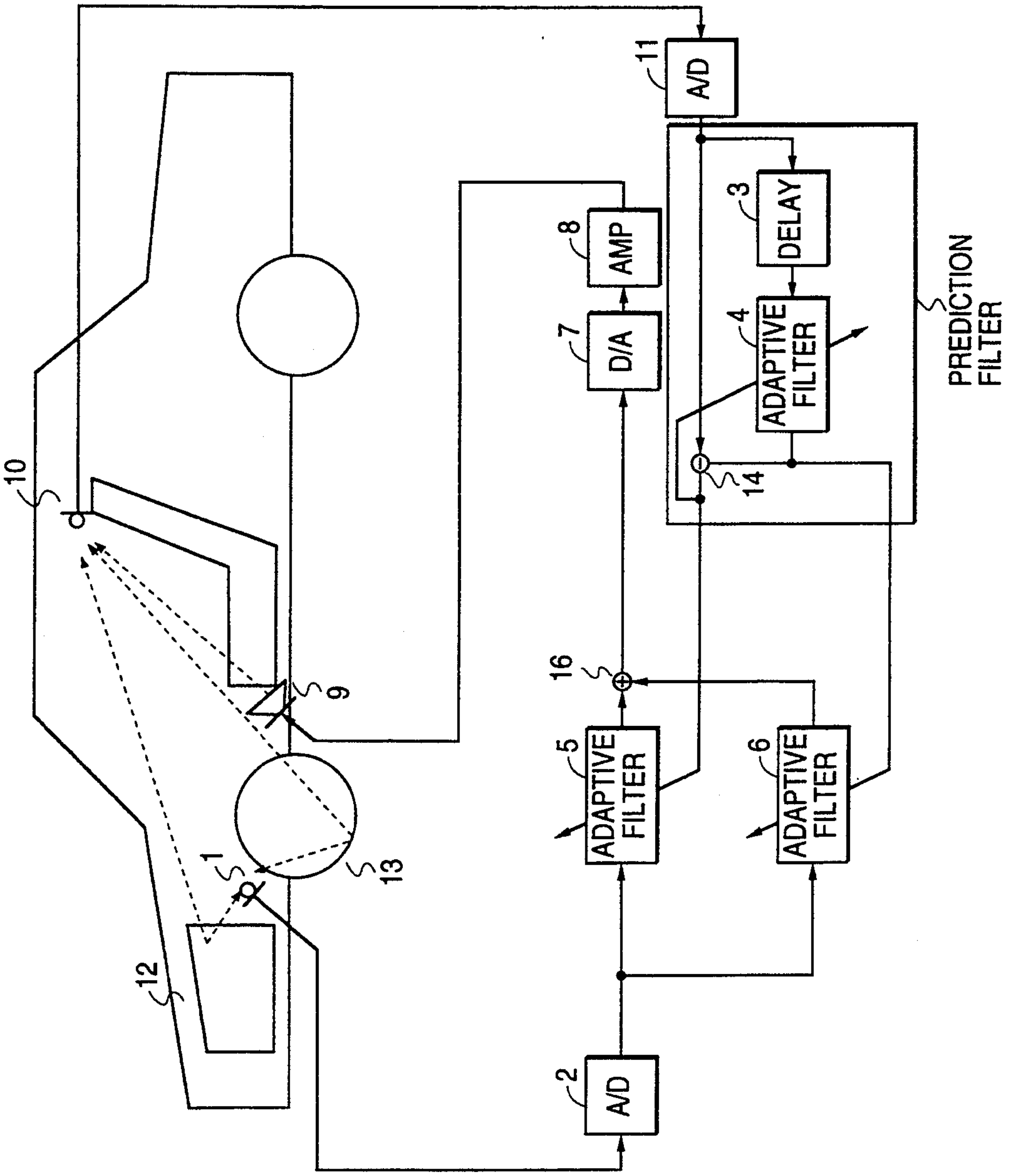
FIG. 5 is a schematic view showing a fourth embodiment of the present invention.

In action, the noise from an engine 12 and front wheels 13 is detected by a noise detector 1 (microphone) as shown in FIG. 5. The resultant noise detection signal of the noise detector 1 is converted by an A/D converter 2 to its digital form. The digital signal is fed to two adaptive filters 5 and 6 of which outputs are then summed by an adder 16. The sum signal of the adder 16 is converted by a D/A converter 7 to an analog signal. The analog signal is fed to a power amplifier 8 for amplification to drive a control speaker 9. The control speaker 9 thus produces a control sound which is directed towards a noise control point or the head of a driver to cancel the noise from the engine 12 and the front wheels 13. A difference at the noise control point between the control sound and the unwanted noise is picked up by an error detector 10 (microphone) and converted by an A/D converter 11 to a digital error detection signal. The digital error signal is transmitted to the prediction filter which comprises a delayer 3, an adaptive filter 4, and a subtractor 14 for extracting a random component from the error detection signal. The random component is utilized to update the coefficients of the two adaptive filters 4 and 5 so that the level of the random component of the error detection signal becomes minimum. Also, the adaptive filter 4 delivers a periodic component of the error detection signal to the adaptive filter 6 for updating its coefficient to minimize the level of the periodic component.

The algorithm for updating the coefficients of the three filters 4, 5, and 6 may use the LMS method.

The fourth embodiment allows its adaptive filter 4 to be coefficient updated so that a difference between the error detection signal and the delay signal of the delayer 3 is minimized in level and to deliver the periodic component which is predictable from the preceding signal.

The subtractor 14 separates the random component by subtracting the periodic component from the original error detection signal. The random and periodic components of the error detection signal are used for coefficient updating the two adaptive filters 5 and 6 respectively. Accordingly, even if the noise intercepted at the noise control point contains both random and periodic components, it can be canceled through suppressing the two components equally at one time by the action of the two adaptive filters 5 and 6 which have been coefficient updated to establish an optimum noise transfer function and to respond to a change (in gain or phase) of the periodic component respectively.

Although the detector of each type, only one noise detector or the error detector, is used in the fourth embodiment, two or more detectors may be used with equal success.

A fifth embodiment of the present invention will now be described referring to FIG. 6. A noise controller of the fifth embodiment includes a first prediction filter for processing the noise detection signal and a second prediction filter for processing the error detection signal. Each detection signal is divided into two, periodic and random, components which are then processed by their respective adaptive filters for discrete processing so that they are suppressed equally at one time regardless of any change in their proportion or level.

Figure 6:
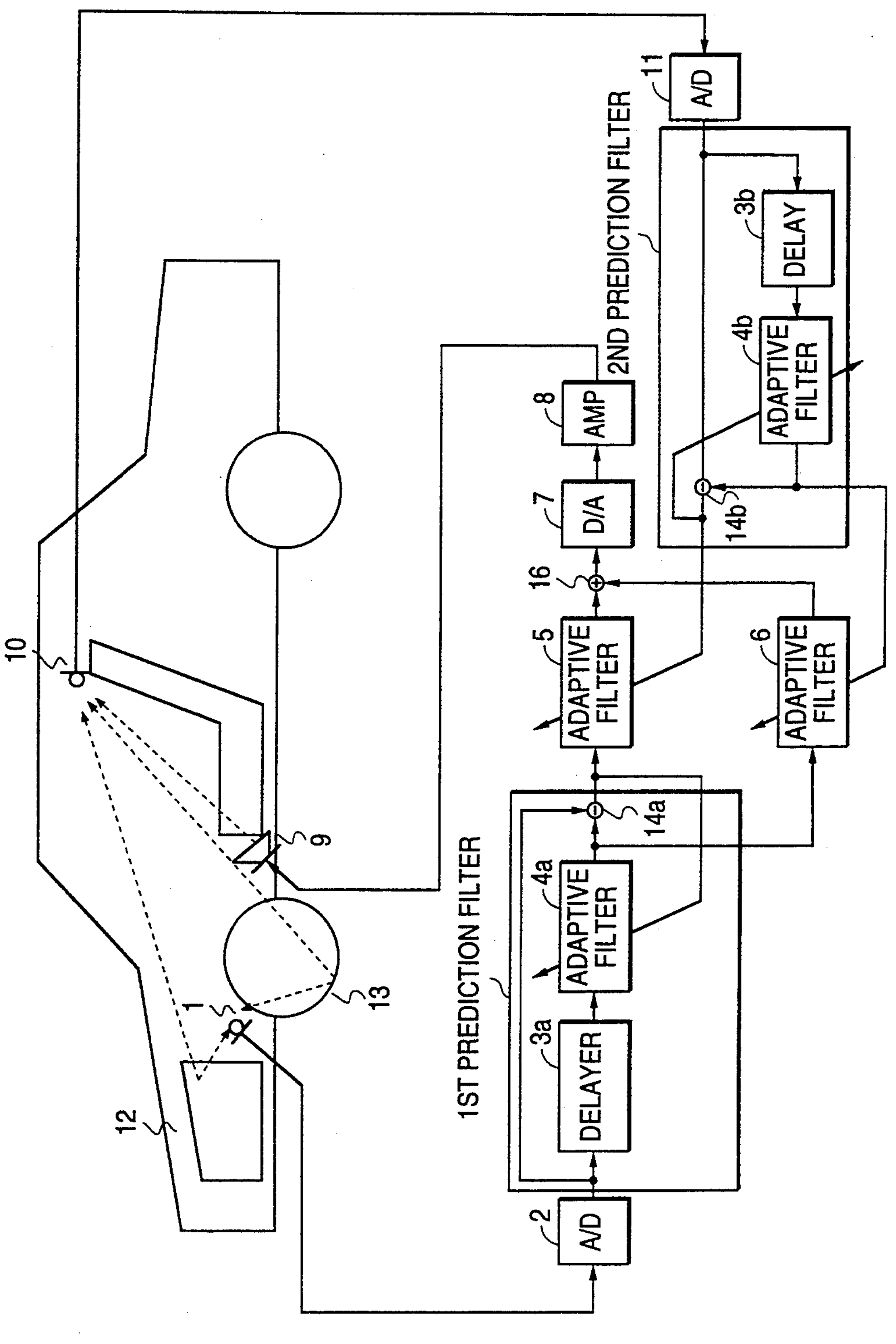
FIG. 6 is a schematic view showing a fifth embodiment of the present invention.

As shown in FIG. 6, the noise is detected by a noise detector 1 (microphone) disposed adjacent to an engine 12 and front wheels 13. The resultant noise detection signal is converted by an A/D converter 2 to its digital form. The digital noise detection signal is delayed a given time by a delayer 3*a*. The delayed noise signal is fed to an adaptive filter 4*a* for separation of its periodic component. The periodic component is transmitted to a subtractor 14*a* where it is subtracted from the original digital noise detection signal to produce a random component. The coefficient of the adaptive filter 4*a* is then updated by the random component of the noise detection signal so that the level of the random component becomes minimum. More specifically, the noise detection signal is divided into the two, periodic and random, components by the first prediction filter which comprises the delayer 3*a*, the adaptive filter 4*a*, and the subtractor 14*a*. The periodic and random components are processed by two adaptive filters 6 and 5 respectively. Two outputs of the adaptive filters 5 and 6 are summed by an adder 16. The sum signal of digital form from the adder 16 is converted back by a D/A converter 7 to its analog form. The analog signal of the D/A converter 7 is amplified by a power amplifier 8 to drive a control speaker 9. The control speaker 9 emits a control sound towards the head of a driver or noise control point to cancel the noise from the engine 12 and the front wheels 13. A difference at the noise control point between the control sound and the undesired noise is picked up by an error detector 10 (microphone). The resultant difference or error detection signal of the error detector 10 is converted by an A/D converter 11 to its digital form. The digital error detection signal is fed to the second prediction filter which comprises a delayer 3*b*, an adaptive filter 4*b*, and a subtractor 14*b* for separation of a random component. The random component separated from the error detection signal is used for updating the coefficients of the two adaptive filters 4*b* and 5 so that the level of the random component becomes minimum. Also, the periodic component separated from the error detection signal by the adaptive filter 4*b* is used for updating the coefficient of an adaptive filter 6 so that the level of the periodic component becomes minimum. The algorithm for updating the coefficient in the adaptive filters 4*a*, 4*b*, 5, and 6 may use the LMS method or an equivalent.

The fifth embodiment allows the noise detection signal to be divided by the first prediction filter into two, periodic and random, components which are then processed by the two adaptive filters 6 and 5 respectively. Also, the two adaptive filters 5 and 6 are coefficient updated by the random and periodic components of the error detection signal respectively which have been separated by the second prediction filter. Accordingly, even if the noise intercepted at the control position contains both random and periodic components, it can be canceled through suppressing the two components equally at one time by the action of the two adaptive filters 5 and 6 which have been coefficient updated to establish an optimum noise transfer function and to respond to a change (in gain or phase) of the periodic component respectively. While the generation of a noise detection signal has been described and an error detection signal, it is possible for two or more of the signals of each type to be provided for canceling the noise.

A sixth embodiment of the present invention will be described referring to FIG. 7. A noise controller of the sixth embodiment contains a first prediction filter for processing the noise detection signal and a second prediction filter for processing the error detection signal, in which each detection signal is divided into two, periodic and random, components which are then filtered by their respective filters separately so that they are equally suppressed at one time regardless of any change in their proportion or level. In particular, the input reference signal to the coefficient updator of each adaptive filter is processed by extra filters which have been updated in the same manner as of the adaptive filter of the second prediction filter.

Figure 7:
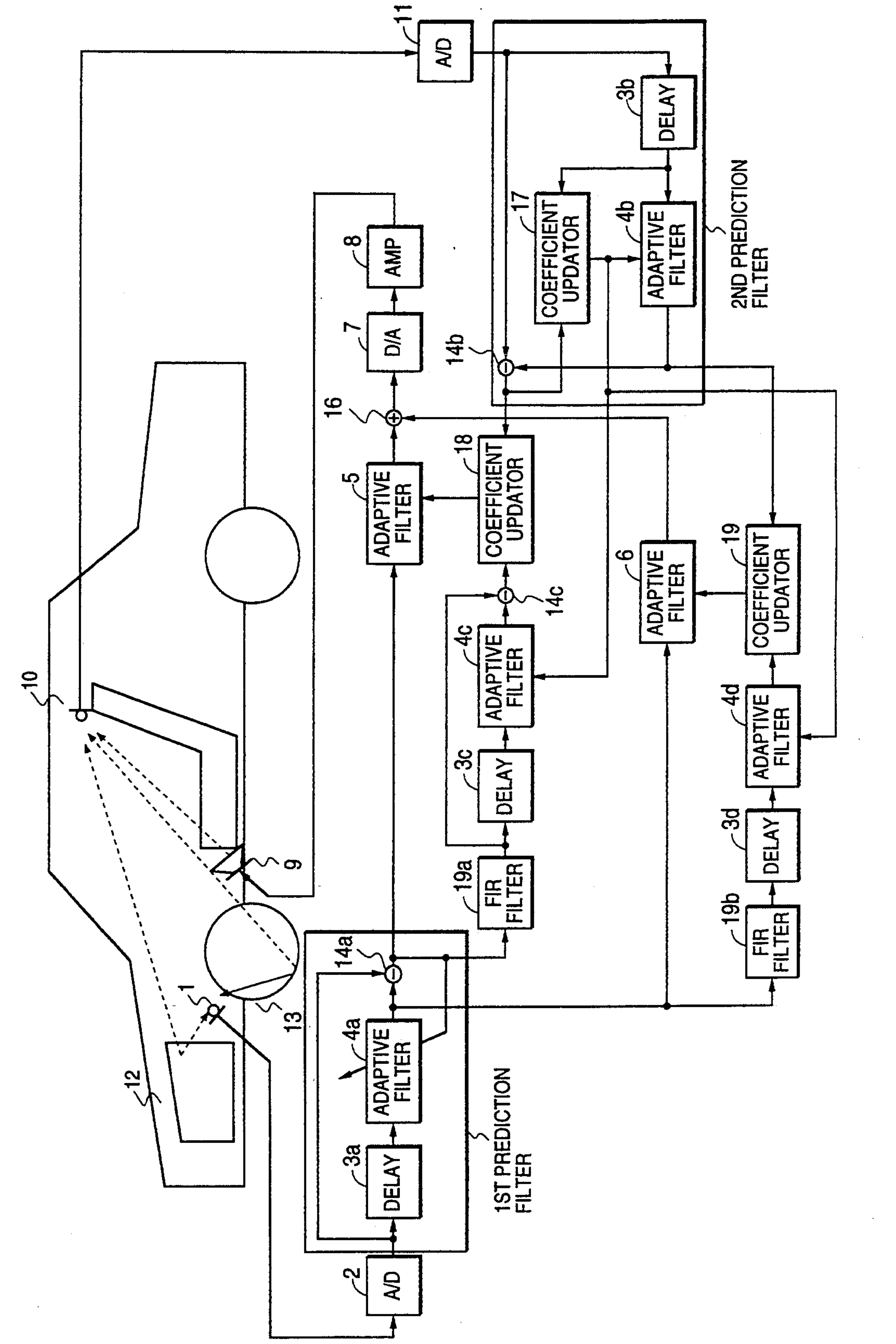
FIG. 7 is a schematic view showing a sixth embodiment of the present invention.

As illustrated in FIG. 7, the noise is detected by a noise detector 1 (microphone) disposed adjacent to an engine 12 and front wheels 13. The resultant noise detection signal is converted by an A/D converter 2 to its digital form. The digital noise detection signal is delayed a given time by a delayer 3*a*. The delayed noise signal is fed to an adaptive filter 4*a* for separation of its periodic component of digital form. The periodic component is transmitted to a subtractor 14*a* where it is subtracted from the original digital noise detection signal to produce a random component. The coefficient of the adaptive filter 4*a* is then updated so that the level of the random component becomes minimum. More specifically, the noise detection signal is divided into the two, periodic and random, components by the first prediction filter which comprises the delayer 3*a*, the adaptive filter 4*a*, and the subtractor 14*a*. The periodic and random components are processed by two adaptive filters 6 and 5 respectively. Two outputs of the adaptive filters 5 and 6 are summed by an adder 16. The sum signal of digital form from the adder 16 is converted back by a D/A converter 7 to its analog form. The analog signal of the D/A converter 7 is amplified by a power amplifier 8 to drive a control speaker 9. The control speaker 9 emits a control sound towards the head of a driver or noise control point to cancel the noise from the engine 12 and the front wheels 13. A difference at the noise control point between the control sound and the undesired noise is picked up by an error detector 10 (microphone) disposed at the noise control point. The resultant difference or error detection signal of the error detector 10 is converted by an A/D converter 11 to its digital form. The digital error detection signal is fed to the second prediction filter which comprises a delayer 3*b*, an adaptive filter 4*b*, and a subtractor 14*b* and consequently, its random component is separated and released from the subtractor 14*b*. The random component of the subtractor 14*b* is transmitted as the input error signal to a coefficient updator 17 which in turn updates the coefficient of the adaptive filter 4*b* with reference to the output of the delayer 3*b* so that the level of the input error signal becomes minimum.

Also, the random component of the noise detection signal or output of the adder 14*a* of the first prediction filter is fed to an FIR (finite impulse response) filter 19*a* in which the impulse response from the D/A converter 7 to the A/D converter 11 is subjected to a convolutional process. The output of the FIR filter 19*a* is delayed by a time with a delayer 3*c*. The output of the delayer 3*c* is processed by an adaptive filter 4*c* whose coefficient is updated by the coefficient updator 17 and is thus identical to that of the adaptive filter 4*b*. A subtractor 14*c* subtracts the output of the adaptive filter 4*c* from the output of the FIR filter 19*a* to calculate a difference output which is transmitted to a coefficient updator 18. In response to the input error signal from the subtractor 14*b*, the coefficient updator 18 updates the coefficient of the adaptive filter 5 with reference to the input reference signal or output of the subtractor 14*c* so that the level of the input error signal becomes minimum. Similarly, the periodic component of the noise detection signal or output of the adaptive filter 4*a* of the first prediction filter is fed to another FIR filter 19*b* in which the impulse response from the D/A converter 7 to the A/D converter 11 is subjected to convolutional process. The output of the FIR filter 19*b* is delayed by a time with a delayer 3*d*. The output of the delayer 3*d* is processed by an adaptive filter 4*d* whose coefficient is updated by the coefficient updator 17 and is thus identical to that of the adaptive filter 4*b*. The output of the subtractor 4*d* is fed as the input reference signal to a coefficient updator 19 which updates the coefficient of the adaptive filter 6 in response to the input error signal or output of the subtractor 14*b* so that the level of the input error signal becomes minimum. The algorithm for updating the coefficient in the adaptive filters 4*a*, 4*b*, 4*c*, and 4*d* and the coefficient updators 18 and 19 may use the LMS method or an equivalent.

According to the sixth embodiment, the noise detection signal is divided by the first prediction filter into two, periodic and random, components which are then processed by the two adaptive filters 6 and 5 respectively. Also, the two adaptive filters 5 and 6 are coefficient updated by the random and periodic components of the error detection signal respectively which have been separated by the second prediction filter. Accordingly, even if the noise intercepted at the noise control point contains both random and periodic components, it can be canceled through suppressing the two components equally at one time by the action of the two adaptive filters 5 and 6 which have been coefficient updated to establish an optimum noise transfer function and to respond to a change (in gain or phase) of the periodic component respectively.

In addition, the transfer function involving from the D/A converter 7 to the error detector 10, the A/D converter 11, and the output of the subtractor 14*b* is equal to the transfer function involving from the FIR filter 19*a* to the subtractor 4*c*. Similarly, the transfer function from the D/A converter 7 to the error detector 10, the A/D converter 11, and the output of the subtractor 4*b* is equal to the transfer function from the FIR filter 19*b* to the subtractor 4*d*. Accordingly, the signal processing requirements of the filtered-X LMS-algorithm described in "Adaptive Signal Processing" written by B. Widrow and S. D. Stearns and published by Prentice-Hall, Inc. (US) in 1985, p. 291 are satisfied thus designating the favorable filter characteristics of both the adaptive filters 5 and 6.

While the generation of a noise detection signal has been described and an error detection signal, it is possible for two or more of the signals of each type to be adapted for canceling the noise.

What is claimed is:

1. A noise controller comprising:

a noise detector for detecting a noise or vibration from a noise or vibration source and delivering a noise detection signal corresponding to a level of the noise or vibration;

a delayer for delaying the noise detection signal by a predetermined length of time;

a first adaptive filter for processing an output of the delayer;

a subtractor for subtracting an output of the first adaptive filter from the noise detection signal produced by the noise detector;

a first coefficient updator responsive to an output of the subtractor for updating a coefficient of the first adaptive filter so that the output of the subtractor becomes minimum;

a second adaptive filter for processing the output of the subtractor;

a third adaptive filter for processing the output of the first adaptive filter;

an adder for summing an output of the second adaptive filter and an output of the third adaptive filter;

a control speaker responsive to an output of the adder for producing a control sound;

an error detector for detecting a difference between the control sound from the control speaker and the noise or vibration and delivering an error detection signal corresponding to the difference;

a second coefficient updator responsive to the error detection signal for updating a coefficient of the second adaptive filter so that the level of the error detection signal becomes minimum; and a third coefficient updator responsive to the error detection signal for updating a coefficient of the third adaptive filter so that the level of the error detection signal becomes minimum.

2. A noise controller comprising:

first and second noise detectors each for detecting a noise or vibration from a noise or vibration source and delivering a noise detection signal corresponding to a level of the noise or vibration;

a first delayer for delaying by a predetermined length of time the noise detection signal from the first noise detector;

a first adaptive filter for processing an output of the first delayer;

a first subtractor for subtracting an output of the first adaptive filter from the noise detection signal produced by the first noise detector;

a second delayer for delaying by a predetermined length of time the noise detection signal from the second noise detector;

a second adaptive filter for processing an output of the second delayer;

a second subtractor for subtracting an output of the second adaptive filter from the noise detection signal produced by the second noise detector;

a third adaptive filter for processing an output of the first subtractor;

a fourth adaptive filter for processing the output of the first adaptive filter;

a fifth adaptive filter for processing an output of the second subtractor;

a sixth adaptive filter for processing the output of the second adaptive filter;

an adder for summing outputs of the third to sixth adaptive filters;

a control speaker responsive to an output of the adder for producing a control sound; and an error detector for detecting a difference between the control sound from the control speaker and the noise or vibration and delivering an error detection signal corresponding to the difference;

said first adaptive filter including a coefficient updator responsive to the output of the first subtractor for updating a coefficient of the first adaptive filter so that the level of the output of the first subtractor becomes minimum;

said second adaptive filter including a coefficient updator responsive to the output of the second subtractor for updating a coefficient of the second adaptive filter so that the level of the output of the second subtractor becomes minimum; and each of said third to sixth adaptive filters including a coefficient updator responsive to the error detection signal for updating a filter coefficient thereof so that the level of the error detection signal becomes minimum.

3. A noise controller comprising:

a noise detector for detecting a noise or vibration from a noise or vibration source and delivering a noise detection signal corresponding to a level of the noise or vibration;

a delayer for delaying the noise detection signal by a predetermined length of time;

a first adaptive filter for processing an output of the delayer;

a subtractor for subtracting an output of the first adaptive filter from the noise detection signal produced by the noise detector;

second to fifth adaptive filters each for processing an output of the subtractor;

sixth to ninth adaptive filters each for processing the output of the first adaptive filter;

a first adder for summing outputs of the second, third, sixth and seventh adaptive filters;

a second adder for summing outputs of the fourth, fifth, eighth and ninth adaptive filters;

a first control speaker responsive to an output of the first adder for producing a control sound;

a second control speaker responsive to an output of the second adder for producing a control sound; and first and second error detectors each for detecting a difference between the control sound from a corresponding one of the first and second control speakers and the noise or vibration and delivering an error detection signal corresponding to the difference;

said first adaptive filter including a coefficient updator responsive to the output of the subtractor for updating a coefficient of the first adaptive filter so that the level of the output of the subtractor becomes minimum;

each of said second, fourth, sixth and eighth adaptive filters including a coefficient updator responsive to the error detection signal produced by the first error detector for updating a filter coefficient thereof so that the level of the error detection signal becomes minimum; and each of said third, fifth, seventh and ninth adaptive filters including a coefficient updator responsive to the error detection signal produced by the second error detector for updating a coefficient thereof so that the level of the error detection signal becomes minimum.

4. A noise controller comprising:

a noise detector for detecting a noise or vibration from a noise or vibration source and delivering a noise detection signal corresponding to a level of the noise or vibration;

first and second adaptive filters each for processing the noise detection signal;

an adder for summing outputs of the first and second adaptive filters;

a control speaker responsive to an output of the adder for producing a control sound;

an error detector for detecting a difference between the control sound from the control speaker and the noise or vibration and delivering an error detection signal corresponding to the difference;

a delayer for delaying the error detection signal from the error detector by a predetermined length of time;

a third adaptive filter for processing an output of the delayer; and a subtractor for subtracting an output of the third adaptive filter from the error detection signal produced by the error detector;

said first adaptive filter including a coefficient updator responsive to an output of the subtractor for updating a coefficient of the first adaptive filter so that the level of the output of the subtractor becomes minimum;

said second adaptive filter including a coefficient updator responsive to the output of the third adaptive filter for updating a coefficient of the second adaptive filter so that the level of the output of the third adaptive filter becomes minimum; and said third adaptive filter including a coefficient updator responsive to the output of the subtractor for updating a coefficient of the third adaptive filter so that the level of the output of the subtractor becomes minimum.

5. A noise controller comprising:

a noise detector for detecting a noise or vibration from a noise or vibration source and delivering a noise detection signal corresponding to a level of the noise or vibration;

a first delayer for delaying the noise detection signal by a predetermined length of time;

a first adaptive filter for processing an output of the first delayer;

a first subtractor for subtracting an output of the first adaptive filter from the noise detection signal produced by the noise detector;

a second adaptive filter for processing an output of the first subtractor;

a third adaptive filter for processing the output of the first adaptive filter;

an adder for summing outputs of the second and third adaptive filters;

a control speaker responsive to an output of the adder for producing a control sound;

an error detector for detecting a difference between the control sound from the control speaker and the noise or vibration and delivering an error detection signal corresponding to the difference;

a second delayer for delaying the error detection signal by a predetermined length of time;

a fourth adaptive filter for processing an output of the second delayer; and a second subtractor for subtracting an output of the fourth adaptive filter from the error detection signal produced by the error detector;

said first adaptive filter including a coefficient updator responsive to the output of the first subtractor for updating a coefficient of the first adaptive filter so that the level of the output of the first subtractor becomes minimum;

each of said second and fourth adaptive filters including a coefficient updator responsive to an output of the second subtractor for updating a filter coefficient thereof so that the level of the output of the second subtractor becomes minimum; and said third adaptive filter including a coefficient updator responsive to the output of the fourth adaptive filter for updating a coefficient of the third adaptive filter so that the level of the output of the fourth adaptive filter becomes minimum.

6. A noise controller comprising:

a noise detector for detecting a noise or vibration from a noise or vibration source and delivering a noise detection signal corresponding to a level of the noise or vibration;

a first delayer for delaying the noise detection signal by a predetermined length of time;

a first adaptive filter for processing an output of the first delayer;

a first subtractor for subtracting an output of the first adaptive filter from the noise detection signal produced by the noise detector;

a second adaptive filter for processing an output of the first subtractor;

a third adaptive filter for processing the output of the first adaptive filter;

an adder for summing outputs of the second and third adaptive filters;

a control speaker responsive to an output of the adder for producing a control sound;

an error detector for detecting a difference between the control sound from the control speaker and the noise or vibration and delivering an error detection signal corresponding to the difference;

a second delayer for delaying the error detection signal by a predetermined length of time;

a fourth adaptive filter for processing an output of the second delayer;

a second subtractor for subtracting an output of the fourth adaptive filter from the error detection signal produced by the error detector;

a first coefficient updator responsive to the output of the second delayer for updating a coefficient of the fourth adaptive filter so that the output of second delayer becomes minimum;

a first FIR filter for processing the output of the first delayer;

a third delayer for delaying an output of the first FIR filter by a predetermined length of time;

a fifth adaptive filter for processing an output of the third delayer;

a third subtractor for subtracting an output of the fifth adaptive filter from the output of the first FIR filter;

a second coefficient updator responsive to an output of the second subtractor and the third subtractor for updating a coefficient of the second adaptive filter so that the level of the output of second delayer becomes minimum;

a second FIR filter for processing the output of the first adaptive filter;

a fourth delayer for delaying an output of the second FIR filter by a predetermined length of time;

a sixth adaptive filter for processing an output of the fourth delayer; and a third coefficient updator responsive to the output of the fourth adaptive filter and the sixth adaptive filter for updating a coefficient of the third adaptive filter so that the level of the output of the third adaptive filter becomes minimum;

said first adaptive filter including a coefficient updator responsive to the output of the first subtractor for updating a coefficient of the first adaptive filter so that the level of the output of the first subtractor becomes minimum; and a filter coefficent of each of said fifth and sixth adaptive filters being updated by of the first coefficient updator to be the same as the filter coefficient of the fourth adaptive filter.

* * * * *